United States Patent
Zhou

(10) Patent No.: US 11,251,089 B2
(45) Date of Patent: Feb. 15, 2022

(54) SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/984,604

(22) Filed: Aug. 4, 2020

(65) Prior Publication Data

US 2020/0365466 A1    Nov. 19, 2020

Related U.S. Application Data

(62) Division of application No. 15/834,681, filed on Dec. 7, 2017, now Pat. No. 10,770,352.

(30) Foreign Application Priority Data

Dec. 8, 2016 (CN) .......................... 201611125155.3

(51) Int. Cl.
*H01L 21/8234* (2006.01)
*H01L 21/28* (2006.01)
(Continued)

(52) U.S. Cl.
CPC ........ *H01L 21/823456* (2013.01); *C23F 1/00* (2013.01); *H01L 21/28114* (2013.01);
(Continued)

(58) Field of Classification Search
None
See application file for complete search history.

(56) References Cited

U.S. PATENT DOCUMENTS

| 6,509,253 B1 | 1/2003 | Yu |
| 6,730,957 B1 | 5/2004 | Jang |

(Continued)

FOREIGN PATENT DOCUMENTS

| CN | 1378705 A | 11/2002 |
| CN | 106024868 A | 10/2016 |
| CN | 106898610 A | 6/2017 |
| EP | 1058229 A1 | 12/2000 |

OTHER PUBLICATIONS

The European Patent Office (EPO) The Extended European Search Report for 17205927.1 dated Apr. 13, 2018 13 Pages.

*Primary Examiner* — Telly D Green
(74) *Attorney, Agent, or Firm* — Anova Law Group, PLLC

(57) ABSTRACT

A semiconductor device is provided. The semiconductor device includes a base substrate, which include a first region having a first transistor and a second region having a second transistor, the first transistor having a working current smaller than the second transistor. The semiconductor device further includes a first gate electrode on the first region of the base substrate, a second gate electrode on the second region of the base substrate and having an undercut structure, a first source/drain doped region in the base substrate on both sides of the first gate electrode, and a second source/drain doped region in the base substrate on both sides of the second gate electrode.

5 Claims, 7 Drawing Sheets

(51) Int. Cl.
*H01L 21/3213* (2006.01)
*H01L 29/423* (2006.01)
*H01L 29/08* (2006.01)
*H01L 27/088* (2006.01)
*H01L 29/78* (2006.01)
*H01L 29/16* (2006.01)
*H01L 29/161* (2006.01)
*C23F 1/00* (2006.01)

(52) U.S. Cl.
CPC .. *H01L 21/32135* (2013.01); *H01L 21/32137* (2013.01); *H01L 21/32139* (2013.01); *H01L 21/823418* (2013.01); *H01L 27/088* (2013.01); *H01L 27/0886* (2013.01); *H01L 29/0847* (2013.01); *H01L 29/42376* (2013.01); *H01L 21/823431* (2013.01); *H01L 29/161* (2013.01); *H01L 29/1608* (2013.01); *H01L 29/7848* (2013.01)

(56) References Cited

U.S. PATENT DOCUMENTS

| | | | |
|---|---|---|---|
| 9,048,214 B2 * | 6/2015 | Padmanabhan | H01L 29/7813 |
| 9,716,009 B2 * | 7/2017 | Kobayashi | H01L 29/42368 |
| 2002/0000633 A1 | 1/2002 | Miyashita | |
| 2002/0100945 A1 | 8/2002 | Mandelman et al. | |
| 2004/0113212 A1 | 6/2004 | Lee et al. | |
| 2004/0180522 A1 | 9/2004 | Nishida et al. | |
| 2007/0029616 A1 | 2/2007 | Choi | |
| 2010/0301421 A1 | 12/2010 | Kronholz et al. | |
| 2013/0299916 A1 | 11/2013 | Won et al. | |
| 2014/0054682 A1 * | 2/2014 | Padmanabhan | H01L 29/7813 257/330 |
| 2014/0361343 A1 | 12/2014 | Sriram | |
| 2016/0093719 A1 * | 3/2016 | Kobayashi | H01L 29/66734 257/330 |
| 2016/0293493 A1 | 10/2016 | Fan et al. | |
| 2017/0179117 A1 | 6/2017 | Chang et al. | |

* cited by examiner

SEMICONDUCTOR DEVICE

CROSS-REFERENCES TO RELATED APPLICATIONS

This application is a divisional of U.S. patent application Ser. No. 15/834,681, filed on Dec. 7, 2017, which claims the priority of Chinese patent application No. 201611125155.3, filed on Dec. 8, 2016, the entirety of which is incorporated herein by reference.

FIELD OF THE DISCLOSURE

The present disclosure generally relates to the field of semiconductor manufacturing technologies and, more particularly, relates to a semiconductor device and a fabrication method thereof.

BACKGROUND

With the rapid development of semiconductor technologies, the feature size of semiconductor devices continues to decrease, making the integration degree of integrated circuits higher and higher. This also sets higher requirements for the performance of devices.

At present, as the size of the metal oxide semiconductor field effect transistor (MOSFET) becomes smaller, the channel length of the MOSFET needs to be continuously shortened to adapt to a reduced process node. A shorter channel length is advantageous to increase the die density of a chip and increase the switching speed of a MOSFET.

However, when the channel length of devices becomes shorter, the distance between the source and drain of devices is also shortened. Therefore, the controlling capability of gate to channel is degraded and the pinch off of channel by the gate voltage becomes more difficult, causing a subthreshold leakage current phenomenon. That is, the short-channel effects (SCEs) can occur more easily, which has become a crucial technical issue.

To better adapt to a scaled-down size of devices, semiconductor technologies are gradually developed from the planar MOSFET to the more efficient three-dimensional transistors, such as fin field effect transistor (FinFET) with better channel controlling capabilities.

A FinFET device often includes a core device and an input/output (TO) device. Because the working current of an IO device is relatively large, the gate leakage current phenomenon is more likely to occur in a FinFET device.

Therefore, there is a need to resolve the gate leakage current problem of semiconductor devices and to improve the reliability of semiconductor devices. The disclosed device and method are directed to solve one or more problems set forth above and other problems in the art.

BRIEF SUMMARY OF THE DISCLOSURE

One aspect of the present disclosure includes a method for fabricating a semiconductor device. The fabrication method includes providing a base substrate including a first region for forming a first transistor and a second region for forming a second transistor. The working current of the first transistor is smaller than the working current of the second transistor. The fabrication method further includes: forming a gate electrode layer on the base substrate; etching the gate electrode layer to form a first gate electrode in the first region; after forming the first gate electrode, etching the gate electrode layer to form a second gate electrode in the second region, with the second gate electrode having an undercut structure; forming a first source/drain doped region in the base substrate on both sides of the first gate electrode; and forming a second source/drain doped region in the base substrate on both sides of the second gate electrode.

Another aspect of the present disclosure includes a semiconductor device. The semiconductor device includes a base substrate, and the base substrate includes a first region having a first transistor and a second region having a second transistor. The working current of the first transistor is smaller than the working current of the second transistor. The semiconductor device further includes a first gate electrode on the first region of the base substrate; a second gate electrode on the second region of the base substrate, with the second gate electrode having an undercut structure; a first source/drain doped region in the base substrate on both sides of the first gate electrode; and a second source/drain doped region in the base substrate on both sides of the second gate electrode.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
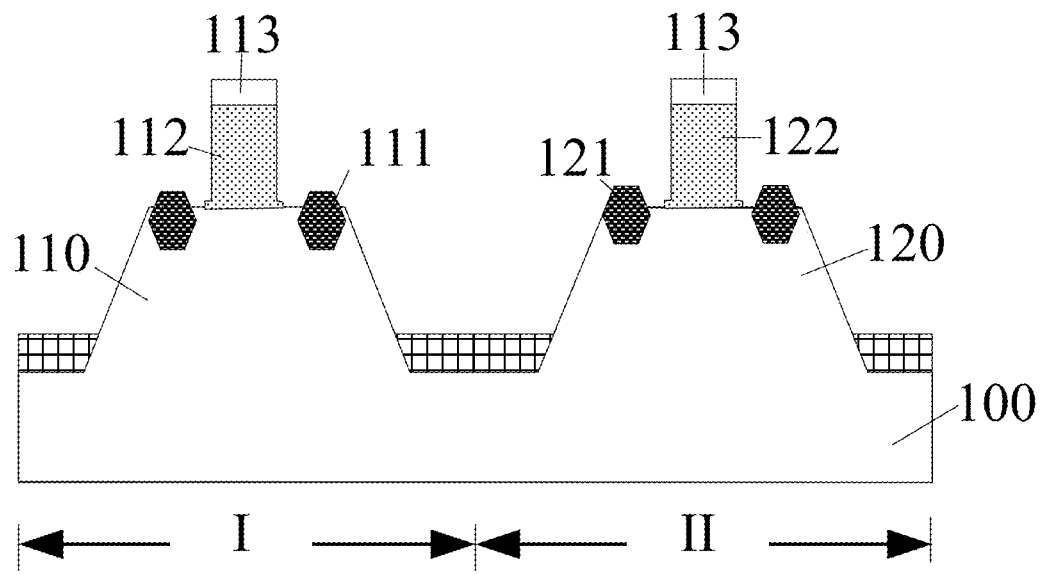
FIG. 1 illustrates a schematic view of a semiconductor device.

FIG. 1 illustrates a schematic cross-sectional view of a semiconductor device. As shown in FIG. 1, the semiconductor device includes a substrate 100 and a plurality of fins protruding from the substrate 100. The substrate 100 includes a first region I and a second region II. The fin on the first region I of the substrate 100 is the first fin 110 and the fin on the second region II of the substrate 100 is the second fin 120. The first region I is used to form a core device and the second region II is used to form an IO device.

The semiconductor device further includes a first gate electrode 112 in the first region I, a second gate electrode 122 in the second region II, a first source/drain region 111 on both sides of the first gate electrode 112, and a second source/drain region 121 on both sides of the second gate electrode 122.

The IO device formed in the second region II may easily cause a gate leakage current phenomenon, so that the reliability of the semiconductor device needs to be improved.

The first gate electrode 112 and the second gate electrode 122 are formed by the following processes: forming a gate electrode layer across the first fin 110; forming a hard mask layer 113 on the gate electrode layer; and etching the gate electrode layer with the hard mask layer 113 as a mask to form a first gate electrode 112 across the first fin 110 and a second gate electrode 122 across the second fin 120, respectively. The first gate electrode 112 covers a portion of the top and sidewall of the first fin 110 and the second gate electrode 122 covers a portion of the top and sidewall of the second fin 120. The first gate electrode 112 and the second gate electrode 122 can be affected by the etching parameters, such as the amount of over-etching. For example, the first gate electrode 112 and the second gate electrode 122 may have a footing structure when the over-etching is insufficient.

The footing structure of the first gate electrode 112 and the second gate electrode 122 has a stepped sidewall, including a lower step portion on the fins and an upper step portion on the lower step portion. The size of the lower step portion is larger than the size of the upper step portion along the direction parallel to the substrate 100.

The working current of the IO device is relatively large. Because the second gate electrode 122 has a footing structure, the distance between the second gate electrode 122 and the second source/drain region 121 is small. Thus, the gate can easily be punched through, causing a leakage current problem.

In the present disclosure, a base substrate is provided, and the base substrate includes a first region for forming a first transistor and a second region for forming a second transistor. The working current of the first transistor is smaller than the working current of the second transistor. A gate electrode layer is further formed on the base substrate. The gate electrode layer is then etched to form a first gate electrode in the first region. After forming the first gate electrode, the gate electrode layer is etched to form a second gate electrode in the second region, with the second gate electrode having an undercut structure. A first source/drain doped region is then formed on the base substrate on both sides of the first gate electrode, and a second source/drain doped region is formed on the base substrate on both sides of the second gate electrode.

Figure 14:
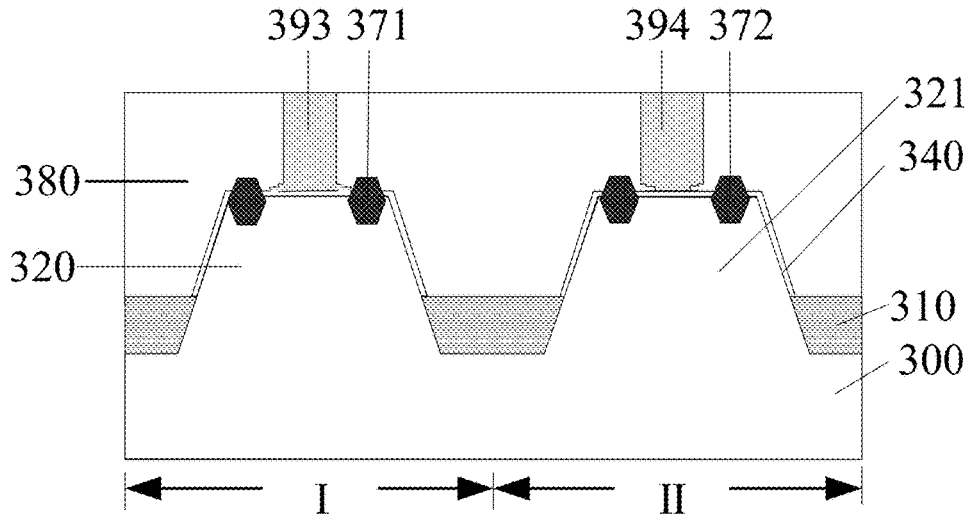

In the present disclosure, a second gate electrode having an undercut structure at its bottom is formed. The undercut structure of the second gate electrode has a stepped sidewall, including a first step portion on the base substrate and a second step portion on the first step portion as shown in FIG. 14. The size of the second step portion is larger than the size of the first step portion. The distance between the second gate electrode and the second source/drain doped region is increased by making the width of the second gate electrode structure smaller than the top width. Therefore, the gate leakage current phenomenon can be suppressed even if the working current of the second transistor is relatively large, and the reliability of the semiconductor device is improved.

Figure 13:
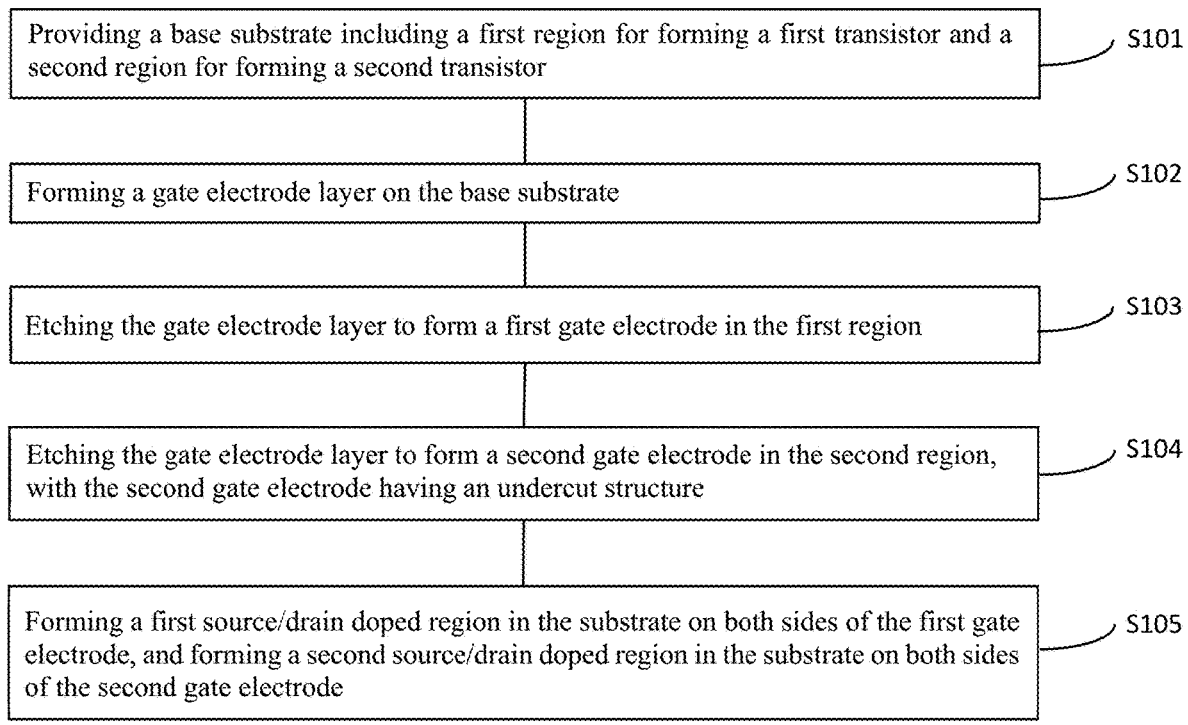
FIG. 13 illustrates an exemplary fabricating process of a semiconductor device consistent with the disclosed embodiments.

FIG. 13 illustrates an exemplary fabrication process of a semiconductor device consistent with the disclosed embodiments; and FIGS. 2-11 illustrate schematic cross-sectional views of semiconductor devices corresponding to certain stages of the exemplary fabrication process consistent with the disclosed embodiments.

As shown in FIG. 13, at the beginning of the fabrication process, a base substrate including a first region and a second region is provided (S101).

Figure 2:
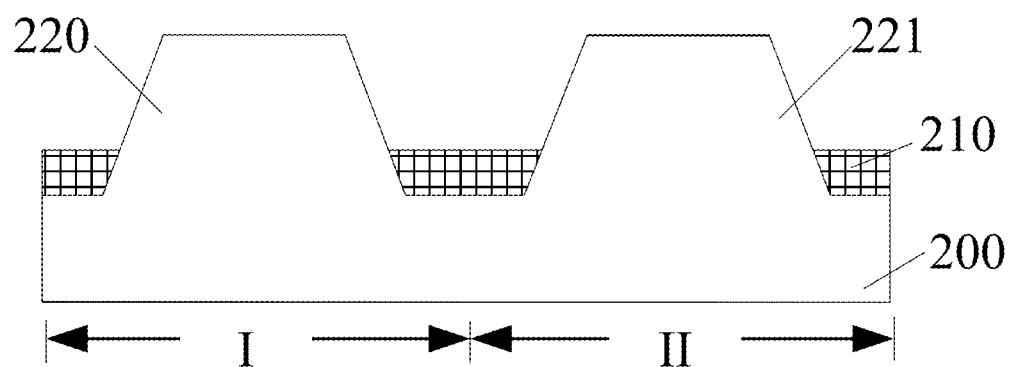
FIGS. 2-11 illustrate schematic structural views of a semiconductor device corresponding to certain stages of a fabrication process consistent with various disclosed embodiments.

As shown in FIG. 2, a base substrate is provided, and the base substrate includes a first region I for forming a first transistor and a second region II for forming a second transistor. The working current of the first transistor is smaller than the working current of the second transistor.

The first region I is used to form a core device, and the second region II is used to form an IO device.

In the present disclosure, a FinFET device is formed as an example of the semiconductor device. For a FinFET device, the base substrate includes a substrate 200 and a plurality of fins on the substrate 200. In other embodiments, the formed semiconductor device may be a planar device, and accordingly, the base substrate is a planar substrate.

In one embodiment, the base substrate includes a substrate 200 and a plurality of fins on the substrate 200. The fins include a first fin 220 on the first region I of the substrate 200 and a second fin 221 on the second region II of the substrate 200. The base substrate also includes an isolation structure 210, and the isolation structure 210 covers a portion of the sidewall surface of the first fin 220 and the second fin 221. The top of the isolation structure 210 is lower than the top of the first fin 220 and the second fin 221.

The isolation structure 210 may electrically isolate the first fin 220 from the adjacent second fin 221.

The substrate 200 may be made of silicon, germanium, silicon germanium, silicon carbide, gallium arsenide, or indium gallium oxide. The substrate 200 may also be made of a silicon-on-insulator (SOI) substrate or a germanium-on-insulator (GOI) substrate. The first fin 220 and the second fin 221 may be made of silicon, germanium, silicon germanium, silicon carbide, gallium arsenide, or indium gallium, and the isolation structure 210 may be made of silicon oxide, silicon nitride, or silicon oxynitride. In one embodiment, the substrate 200 is a silicon substrate; the first fin 220 and the second fin 221 are made of silicon; and the isolation structure 210 is made of silicon oxide.

In one embodiment, the substrate 200, the first fin 220, and the second fin 221 are formed by the following processes: providing an initial substrate; forming a patterned hard mask layer on surface of the initial substrate; etching the initial substrate with the hard mask layer as a mask and the etched initial substrate being the substrate 200; the protrusion on the first region I of the surface of the substrate 200 being the first fin 220 and the protrusion on the second region II of the surface of the substrate 200 being the second fin 221; and removing the hard mask layer after forming the first fin 220 and the second fin 221.

In particular, the process of forming the hard mask layer includes: first forming an initial hard mask layer; forming a patterned photoresist layer on the surface of the initial hard mask layer; etching the initial hard mask layer by using the patterned photoresist layer as a mask to form a hard mask layer on the surface of the initial substrate; and removing the patterned photoresist layer. In other embodiments, the process of forming the hard mask layer may also include a self-aligned double patterned process, a self-aligned triple patterned process, a self-aligned double double patterned process. The double patterned process may be a litho-etch-litho-etch (LELE) process or a litho-litho-etch (LLE) process.

The processes of forming the isolation structure 210 include: forming an isolation film covering the first fin 220 and the second fin 221 on the substrate 200, with the top of the isolation film being higher than the top of the first fin 220 and the second fin 221; subjecting the top of the isolation film to a planarization process; after the planarization treatment, etching-back a partial thickness of the isolation film to form the isolation structure 210 on the substrate 200.

Figure 3:
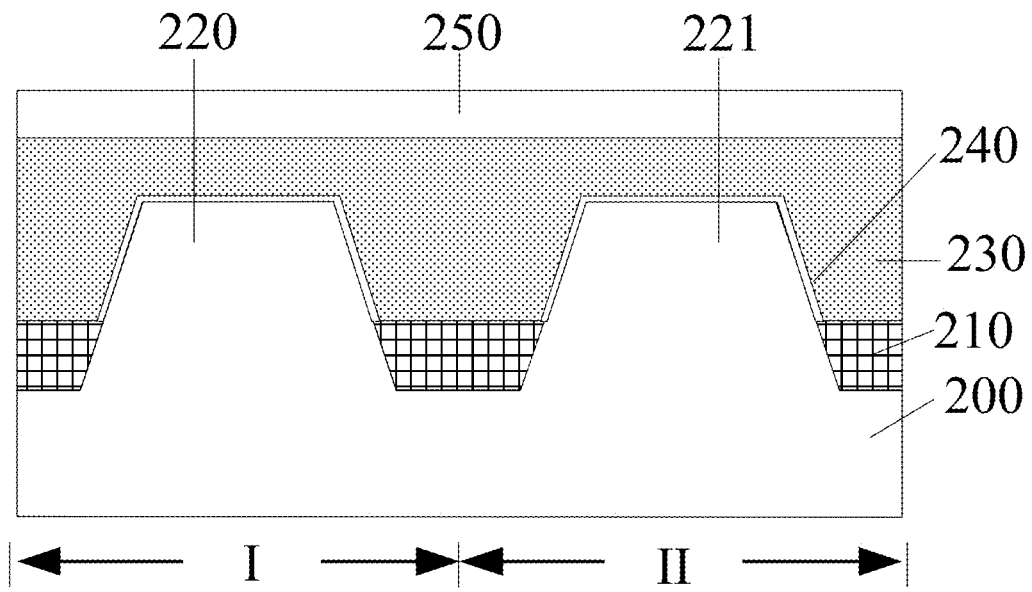

Returning to FIG. 13, after providing the base substrate, a gate electrode layer is formed on the base substrate (S102). As shown in FIG. 3, a gate electrode layer 230 is formed on the base substrate, and the gate electrode layer 230 covers the first fin 220 and the second fin 221.

The gate electrode layer 230 may be made of polysilicon or a metal, and the metal may be one or more of Ti, Ta, TiN, TaN, TiAl, TiAlN, Cu, Al, W, Ag or Au.

A gate dielectric layer 240 may also be formed on the base substrate before forming the gate electrode layer 230. The gate dielectric layer 240 is made of a high-k gate dielectric material.

An interfacial layer may also be formed between the gate dielectric layer 240 and the first fin 220. The interfacial layer is made of silicon oxide.

Returning to FIG. 13, after forming the gate electrode layer, a first gate electrode is formed in the first region of the base substrate by etching the gate electrode layer (S103).

Figure 4:
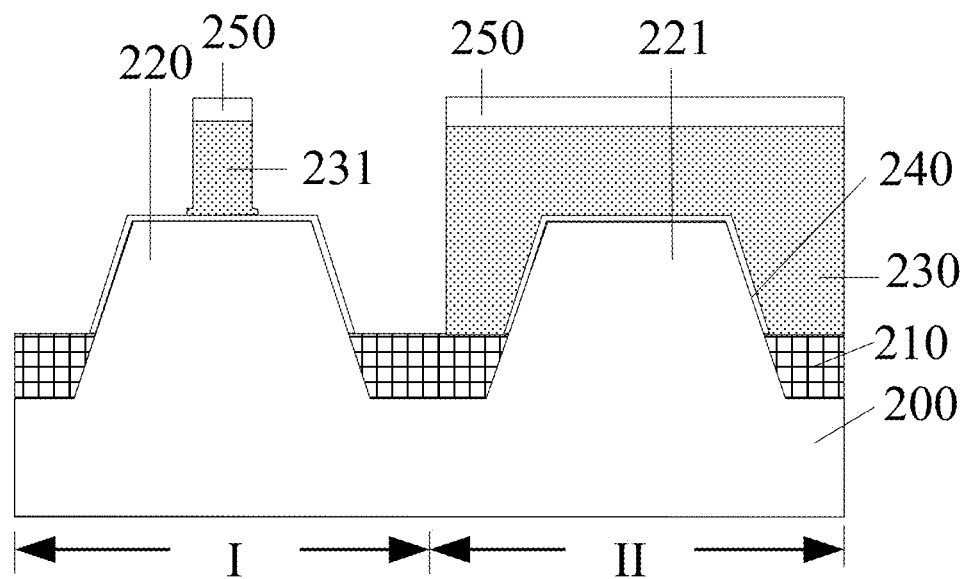

As shown in FIG. 4, the gate electrode layer 230 is etched, and a first gate electrode 231 is formed in the first region I.

In one embodiment, since the base substrate includes the substrate 200 and fins, the formed first gate electrode 231 is across the first fin 220 and covers a portion of the top and sidewall of the first fin 220.

The first gate electrode 231 may be made of polysilicon or a metal, and the metal may be one or more of Ti, Ta, TiN, TaN, TiAl, TiAlN, Cu, Al, W, Ag or Au.

The process of forming the first gate electrode 231 includes: forming a hard mask layer 250 on the gate electrode layer 230, with the hard mask layer 250 defining the pattern of the first gate electrode 231 to be formed; using the hard mask layer 250 as a mask, patterning the gate electrode layer 230 in the first region I to form a first gate electrode 231 in the first region I. In one embodiment, the bottom of the first gate electrode 231 has a footing structure due to over-etching in the etching process. That is, the footing structure of the first gate electrode 231 has a stepped sidewall including a third step portion on the base substrate and a fourth step portion on the third step portion as shown in FIG. 14. The size of the third step portion is greater than the size of the fourth step portion along the direction parallel to the base substrate. The size of the footing structure of the first gate electrode 231 may be in a range of 1~5 nm. Since the working current of the core device formed in the first region I is low, even if the first gate electrode 231 has a footing structure, the first gate electrode 231 is unlikely to be punched through.

In other embodiments, the first gate electrode 231 may also be in an undercut structure or a vertical structure, which may further overcome the gate leakage problem.

When the first gate electrode 231 has an undercut structure, the undercut structure of the first gate electrode 231 has a stepped sidewall, including a third step portion on the base substrate and a fourth step portion on the third step portion. The size of the third step portion is smaller than the size of the fourth step portion along a direction parallel to the base substrate.

When the first gate electrode 231 has a vertical structure, the width of the first gate electrode 231 is equal to the top width.

In one embodiment, the parameters of the etching process when forming the first gate electrode 231 are as follows: the etching gas is a mixed gas of $CF_4$, $SF_6$, $N_2$ and $O_2$; the gas flow rate of $CF_4$ is approximately 50~175 sccm; the gas flow rate of $SF_6$ is approximately 5~81 sccm; the gas flow rate of $N_2$ is approximately 6~75 sccm; the gas flow rate of the $O_2$ gas is approximately 1~25 sccm; the pressure is approximately 1 mtorr~150 mtorr; the etching time is approximately 10~2000 s; the voltage is approximately 50~300 V; and the RF power is approximately 200~500 W.

In one embodiment, the portion of the hard mask layer 250 at the top of the first gate electrode 231 is retained, such that the hard mask layer 250 protects the top of the first gate electrode 231 during the subsequent process. The hard mask layer 250 may be made of silicon nitride, silicon oxynitride, silicon carbide, or boron nitride.

Returning to FIG. 13, after forming the first gate electrode, the fabrication method further includes forming a second gate electrode in the second region (S104).

Figure 5:
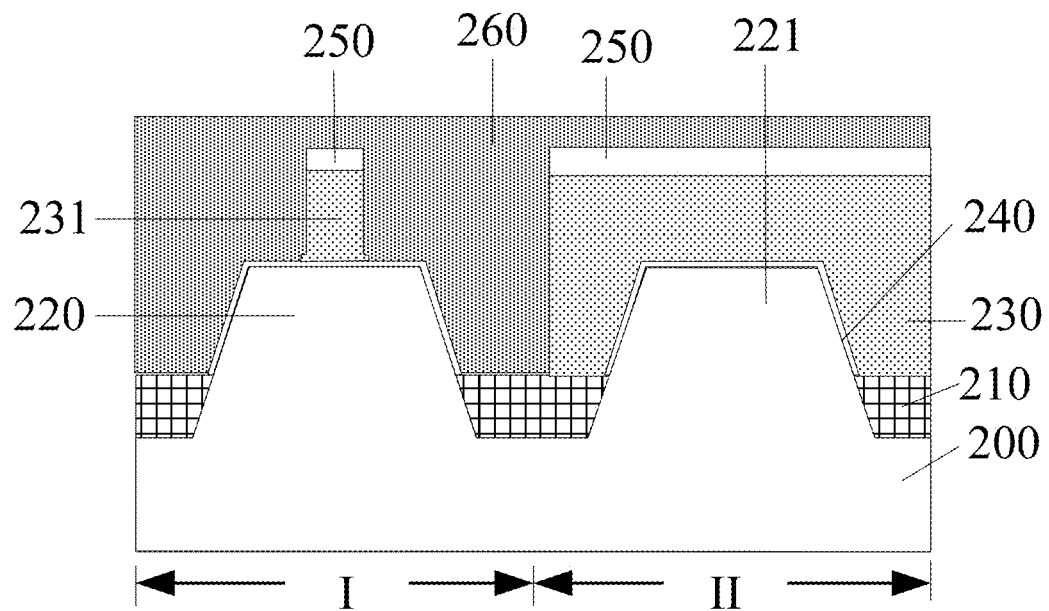
Figure 6:
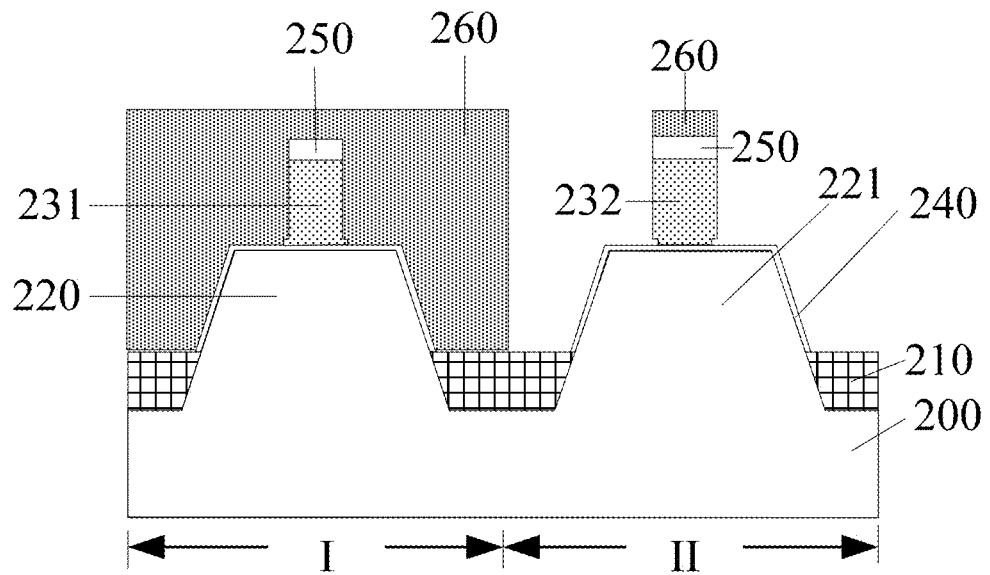
Figure 7:
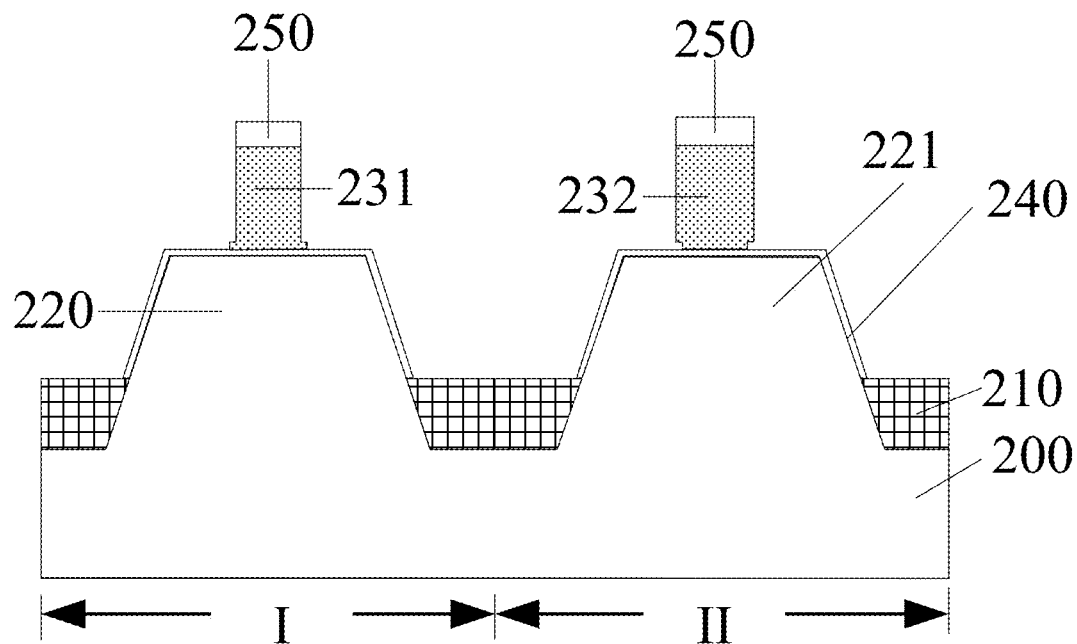

As shown in FIGS. 5-7, after forming the first gate electrode 231, the gate electrode layer 230 is etched to form the second gate electrode 232 in the second region II. The second gate electrode 232 has an undercut structure.

In one embodiment, the undercut structure of the second gate electrode 232 has a stepped sidewall, including a first step portion on the substrate and a second step portion on the first step portion. The size of the first step portion is smaller than the size of the second step portion along the direction parallel to the substrate. The second gate electrode 232 has an undercut structure.

The size of the undercut structure of the second gate electrode 232 should be neither too large nor too small in the direction parallel to the substrate. When the size of the undercut structure is too large, it is likely that the distance between the subsequently formed second source/drain doped region and the channel formed is insufficient, and the performance of the device is reduced. When the size of the undercut structure is too small, there will be a leakage current from the gate to the epitaxial layer. Therefore, in one embodiment, the size of the undercut structure may be in a range of 2~20 nm.

The process of forming the second gate electrode 232 includes an over-etching process. The bottom of the second gate electrode 232 can have an undercut structure by controlling the amount of over-etching. The undercut structure is used to increase the distance between the source/drain and the bottom of the second gate electrode 232. Therefore, even if the working current of the IO device is relatively large, the gate leakage phenomenon can be suppressed, thereby improving the reliability of the semiconductor device.

In the present disclosure, a second gate electrode 232 having an undercut structure is formed by an over-etching process. Specifically, the process of forming the second gate electrode 232 includes:

As shown in FIG. 5, a photoresist layer 260 is formed on the hard mask layer 250, and the photoresist layer 260 covers the top and sidewalls of the first gate electrode 231 and the top of the hard mask layer 250 in the second region II.

As shown in FIG. 6, the photoresist layer 260 is patterned, and a portion of the photoresist layer 260 in the second region II is removed. The remaining photoresist layer 260 in the second region II defines the pattern of the second gate electrode 232 to be formed. Using the patterned photoresist layer 260 as a mask, the gate electrode layer 230 and the hard mask layer 250 in the second region II are etched to form the second gate electrode 232 in the second region II.

When etching to form the second gate electrode 232, the photoresist layer 260 in the first region I is a protective layer of the first gate electrode 231, covering the top and sidewalls of the first gate electrode 231.

In one embodiment, the etching parameters in the process of forming the second gate electrode 232 by over-etching include: the etching gas being a mixed gas of HBr, He and $O_2$, the gas flow rate of HBr being 50~1000 sccm, the gas flow rate of He being 300~1500 sccm, the gas flow rate of O₂ being 1~20 sccm, the pressure being 30~250 mtorr, the etching time being 10~200 s, and the RF power being 700~3000 W.

As shown in FIG. 7, the photoresist layer 260 (see FIG. 6) in the first region I and the second region II is removed, exposing the hard mask layer 250 at the top of the first gate electrode 231 and the second gate electrode 232.

The process of removing the photoresist layer 260 (see FIG. 6) in the first region I and the second region II is a dry etching process. The exposed hard mask layer 250 at the top of the first gate electrode 231 and the second gate electrode 232 is used to protect the top of the first gate electrode 231 and the second gate electrode 232, such that the top of the first gate electrode 231 and the second gate electrode 232 may not be damaged in the subsequent process.

Returning to FIG. 13, after forming the second gate electrode, the fabrication method further includes forming a first source/drain doped region and a second source/drain doped region (S105).

Figure 8:
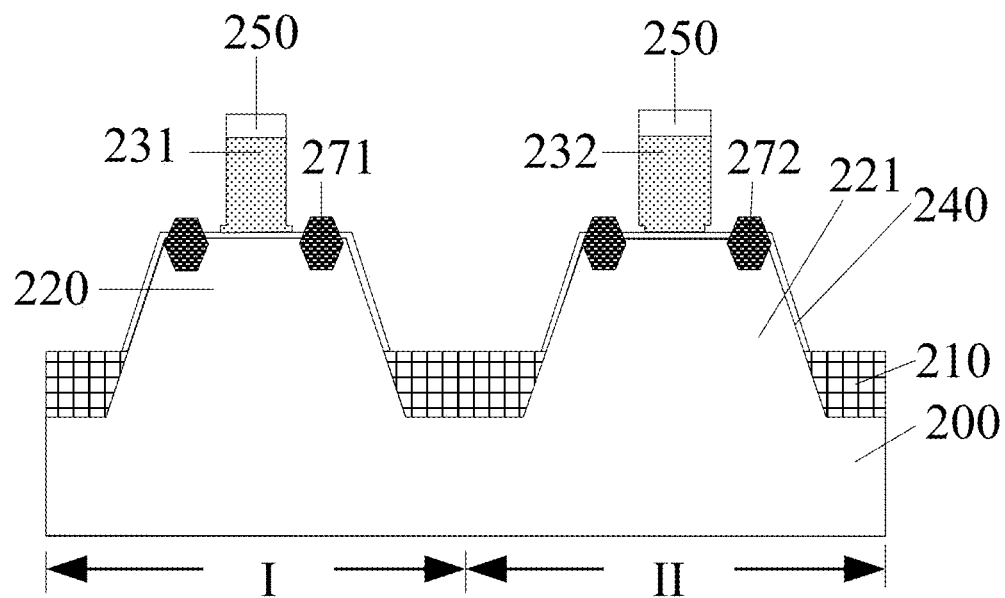

As shown in FIG. 8, a first source/drain doped region 271 is formed on the base substrate on both sides of the first gate electrode 231, and the second source/drain doped region 272 is formed on the base substrate on both sides of the second gate electrode 232.

The first source/drain doped region 271 and the second source/drain doped region 272 are doped with P-type ions or N-type ions.

In one embodiment, the process of forming the first source/drain doped region 271 includes: etching the first fin 220 on both sides of the first gate electrode 231 to form a first trench in the first fin 220 on both sides of the first gate electrode 231; forming a first source/drain doped region 271 that fills up the first trench; and doping P-type or N-type ions in the first source/drain doped region 271. The process of forming the second source/drain doped region 272 includes: etching the second fin 221 on both sides of the second gate electrode 232 to form a second trench in the second fin 221 on both sides of the second gate electrode 232; forming a second source/drain doped region 272 that fills up the second trench; and doping P-type or N-type ions in the second source/drain doped region 271.

In one embodiment, the first source/drain doped region 271 and the second source/drain doped region 272 are formed by a selective epitaxial process. Because the portion of the fin other than the first trench and the second trench is covered by the gate dielectric layer 240 and the lattice constant of the material of the gate dielectric layer 240 is significantly different from the lattice constant of the material of the first source/drain doped region 271 and the second source/drain doped region 272, the epitaxial growth of films in an undesired region is avoided.

When the formed FinFET is an NMOS device, the first source/drain doped region 271 and the second source/drain doped region 272 are made of Si or SiC, and the first source/drain doped region 271 and the second source/drain doped region 272 are doped with N-type ions, with the N-type ions being P, As or Sb; when the formed FinFET is a PMOS device, the first source/drain doped region 271 and the second source/drain doped region 272 are made of Si or SiGe, and the first source/drain doped region 271 and the second source/drain doped region 272 are doped with P-type ions, with the P-type ions being B, Ga or In.

When the first source/drain doped region 271 and the second source/drain region 272 are made of SiC, the first source/drain doped region 271 and the second source/drain doped region 272 may provide a stretching stress to the channel region, increasing the carrier mobilities of the NMOS device; when the first source/drain doped region 271 and the second source/drain region 272 are made of SiGe, the first source/drain doped region 271 and the second source/drain doped region 272 may provide a compression stress to the channel region, increasing the carrier mobilities of the PMOS device.

Figure 9:
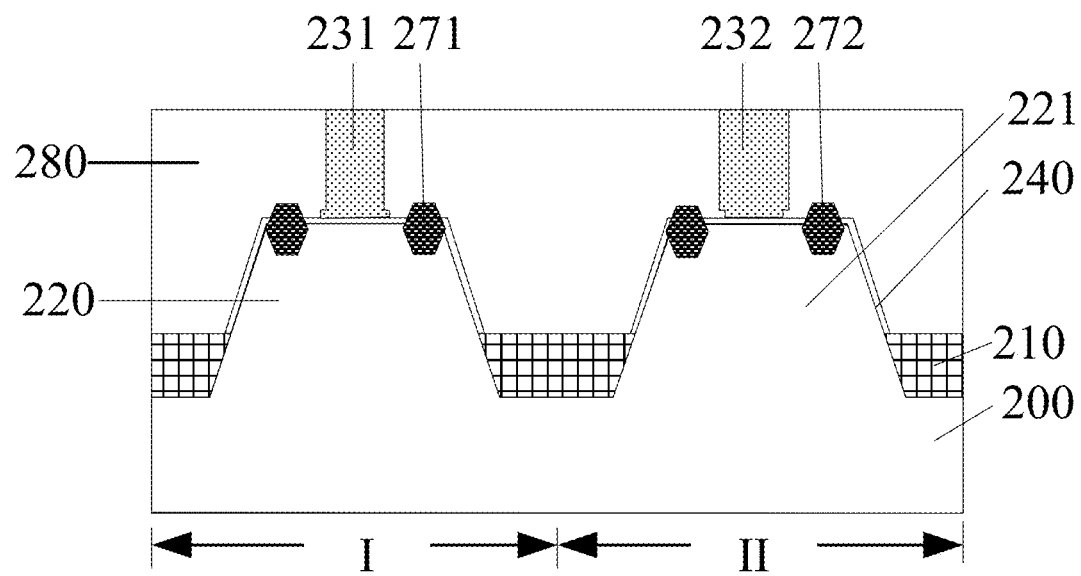

In one exemplary embodiment, the semiconductor device is formed by a rear gate process, and the subsequent process further includes:

As shown in FIG. 9, an interlayer dielectric layer 280 is formed on the portion of the base substrate exposed by the first gate electrode 231 and the second gate electrode 232.

The interlayer dielectric layer 280 covers the surface of the base substrate, the surface of the first source/drain doped region 271, the surface of the second source/drain doped region 272, the sidewall of the first gate electrode 231, and the sidewall of the second gate electrode 232.

In the present embodiment, the process of forming the interlayer dielectric layer 280 includes: forming an interlayer dielectric film covering the base substrate, with the top of the interlayer dielectric film being higher than the top of the first gate electrode 231 and the second gate electrode 232; etching the interlayer dielectric film until the top of the first gate electrode 231 and the second gate electrode 232 is exposed to form an interlayer dielectric layer 280; and removing the hard mask layer 250 simultaneously when etching the interlayer dielectric film (as shown in FIG. 8).

Figure 10:
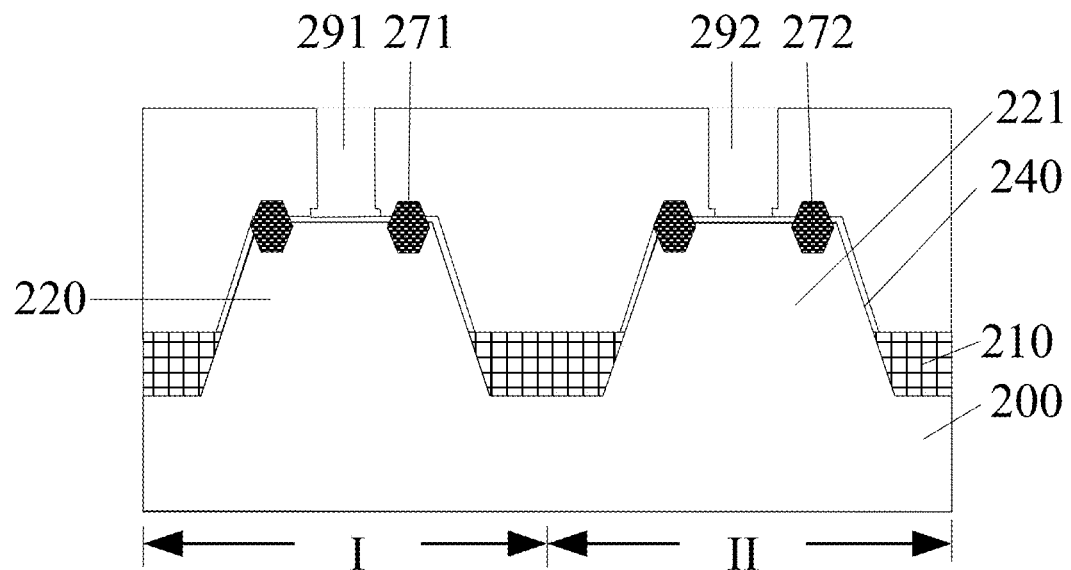

As shown in FIG. 10, the first gate electrode 231 and the second gate electrode 232 are removed to form a first opening 291 and a second opening 292, respectively.

In one embodiment, the process of forming the first opening 291 and the second opening 292 includes: etch-removing the first gate electrode 231 and the second gate electrode 232; forming a first opening 291 in the interlayer dielectric layer 280 of the first region I and forming a second opening 292 in the interlayer dielectric layer 280 of the second region II.

Figure 11:
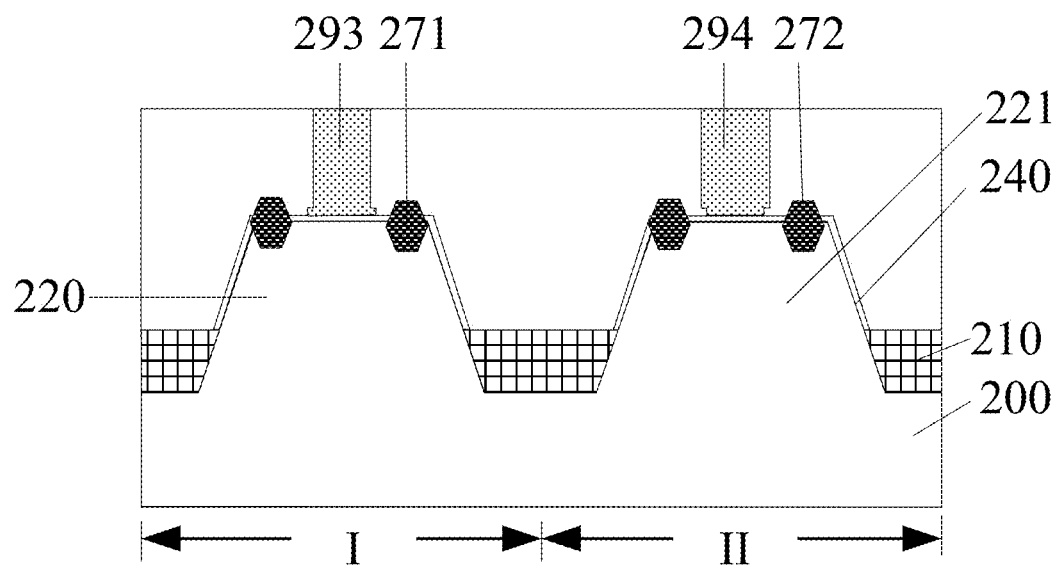

As shown in FIG. 11, the first opening 291 (As shown in FIG. 10) and the second opening 292 (As shown in FIG. 10) are filled with metal, forming a first metal gate 293 and a second metal gate 294, respectively.

Since the second metal gate 294 is at the position of the second gate electrode 232 before being etched, the second metal gate 294 and the second gate electrode 232 have the same structure, i.e., an undercut structure.

After forming the semiconductor device, since the second metal gate 294 has an undercut structure, the undercut structure has a stepped sidewall, including a first step portion on the substrate and a second step portion on the first step portion. The size of the second step portion is larger than the size of the first step portion. An undercut structure is used to increase the distance between the source/drain region and the bottom of the second metal gate. Therefore, by making the width of the second metal gate structure smaller than the top width, the gate leakage phenomenon may be suppressed and the reliability of the semiconductor device may be enhanced.

Accordingly, the present disclosure also provides a semiconductor device.

Figure 12:
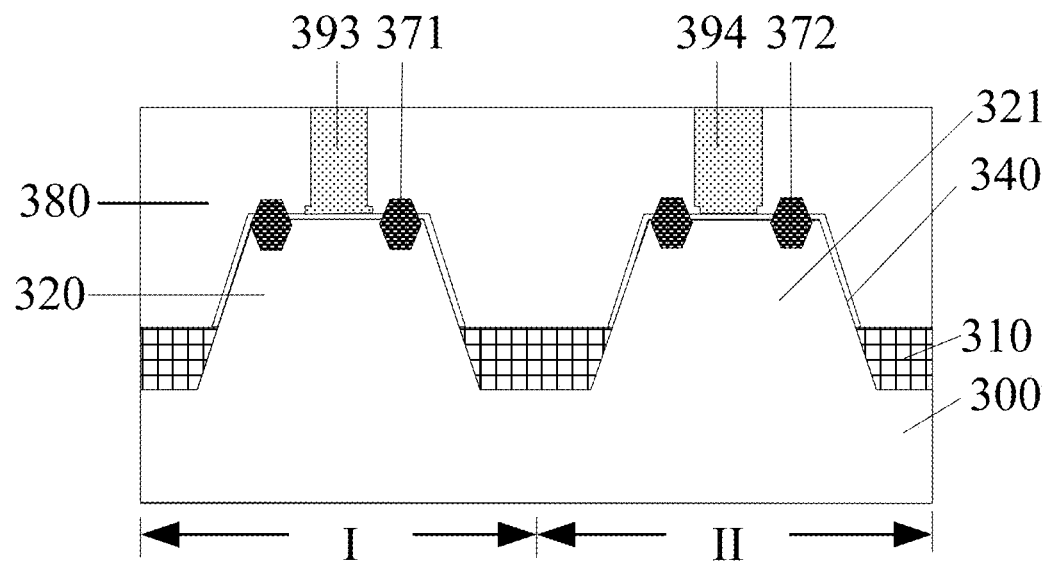
FIG. 12 and FIG. 14 illustrate schematic structural views of exemplary semiconductor devices consistent with various disclosed embodiments.

FIG. 12 illustrates a schematic view of an embodiment of the semiconductor device consistent with the present disclosure.

The semiconductor device includes: a base substrate, and the base substrate includes a first region I having a first transistor and a second region II having a second transistor. The working current of the first transistor is smaller than the working current of the second transistor.

The semiconductor device includes a first gate electrode 393 on the first region I of the substrate; a second gate electrode 394 on the second region II of the substrate, with the second gate electrode 394 having an undercut structure; a first source/drain doped region 371 in the base substrate on both sides of the first gate electrode 393; a second source/drain doped region 372 in the base substrate on both sides of the second gate electrode 394.

In one exemplary embodiment, the semiconductor device is a FinFET device. For a FinFET device, the base substrate includes a substrate 300 and a plurality of fins on the substrate 300. The fins include a first fin 320 on the first region I of the substrate 300 and a second fin 321 on the second region II of the substrate 300. The base substrate also includes an isolation structure 310, and the isolation structure 310 covers a portion of the sidewall surface of the first fin 320 and the second fin 321. The top of the isolation structure 310 is lower than the top of the first fin 320 and the second fin 321.

In one embodiment, the semiconductor device further includes an interlayer dielectric layer 380 on the first gate electrode 393, the second gate electrode 394, and the base substrate. The first gate electrode 393 is the first metal gate on the interlayer dielectric layer 380, and the second gate electrode 394 is the second metal gate on the interlayer dielectric layer.

The first gate electrode 393 is made of a metal, and the metal may be one or more of Ti, Ta, TiN, TaN, TiAl, TiAlN, Cu, Al, W, Ag or Au.

In one embodiment, the bottom of the first gate electrode 393 has a footing structure. That is, the footing structure of the first gate electrode 393 has a stepped sidewall, including a third step portion on the base substrate and a fourth step portion on the third step portion. The size of the third step portion is larger than the size of the fourth step portion along a direction parallel to the substrate. The size of the footing structure of the first gate electrode 393 may be in a range of 1 to 5 nm. Since the working current of the core device formed in the first region I is relatively low, even if the first gate electrode 393 has a footing structure, the first gate electrode 393 may not be easily punched through to cause a leakage current problem.

In other embodiments, the first gate electrode 393 may also have an undercut structure or a vertical structure, which may further suppress the gate leakage phenomenon.

When the bottom of the first gate electrode 393 has an undercut structure, the undercut structure of the first gate electrode 393 has a stepped sidewall, including a third step portion on the base substrate and a fourth step portion on the third step portion. The size of the third step portion is smaller than the size of the fourth step portion in a direction parallel to the base substrate.

When the bottom of the first gate electrode 393 has a vertical structure, the width of the first gate electrode 393 is equal to the top width.

In one embodiment, the undercut structure of the second gate electrode 394 has a stepped sidewall, including a first step portion on the substrate and a second step portion on the first step portion. The size of the first step portion is smaller than the size of the second step portion in a direction parallel to the base substrate. The second gate electrode 394 has an undercut structure. The size of the undercut structure at the bottom of the second gate electrode 394 may be in a range of 2 to 20 nm.

The size of the undercut structure of the second gate electrode 394 may be neither too large nor too small in the direction parallel to the base substrate. That is, the size of the undercut structure may be in a range of 2 to 20 nm. When the size of the undercut structure is larger than 20 nm, the extension from the source/drain doped region to the channel is likely to be insufficient, and the performance of the device is reduced. When the size of the undercut structure is less than 2 nm, a leakage current from the gate to the epitaxial layer may occur. The undercut structure is used to increase the distance between the second source/drain doped region 372 and the bottom of the second gate electrode 394. Therefore, even if the working current of the IO device is large, the gate leakage phenomenon can be suppressed and the reliability of the semiconductor device may be improved.

The first source/drain doped region 371 is doped with P-type ions or N-type ions.

The second source/drain doped region 372 is doped with P-type ions or N-type ions.

As such, the disclosed semiconductor device may include a FinFET device. The FinFET device may include a gate structure having a core device in the first region and an IO device in the second region. The core device has a footing structure while the IO device has an undercut structure. Since an undercut structure of the IO device increases the distance between the bottom of the second gate electrode and the second source/drain doped region in the second region, the gate leakage phenomenon of the semiconductor device is less likely to occur. Therefore, the reliability of the IO device is improved and the performance of the core device is also enhanced.

Compared with conventional technologies, the fabrication method in the present disclosure is advantageous.

In the present disclosure, the fabrication method of a semiconductor device includes providing a base substrate. The base substrate includes a first region for forming a first transistor and a second region for forming a second transistor. The working current of the first transistor is smaller than the working current of the second transistor. A first gate electrode is formed in the first region and a second gate electrode is formed in the second region. When etching the second gate electrode, the width of the second gate electrode is smaller than the top width, such that the second gate electrode has an undercut structure. A second source/drain doped region is formed in the base substrate on both sides of the second gate electrode. Since an undercut structure increases the distance between the bottom of the second gate electrode and the second source/drain doped region, even if the working current of the second transistor is relatively large, the gate leakage phenomenon of the semiconductor device is less likely to occur. Therefore, the reliability of the semiconductor device is improved.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor device, comprising:
  a base substrate, including a first region having a first fin and a second region having a second fin adjacent to the first fin;
  a first gate electrode with a foot structure on the first fin of the first region of the base substrate, wherein the footing structure has a stepped sidewall including a third step portion directly on the base substrate and a fourth step portion directly on the third step portion, and the third step portion has a larger size than the fourth step portion in a direction parallel to a surface of the base substrate;

a second gate electrode on the second fin of the second region of the base substrate and having an undercut structure, wherein the undercut structure has a stepped sidewall including a first step portion on the base substrate and a second step portion on the first step portion, and the first step portion has a smaller size than the second step portion in a direction parallel to a surface of the base substrate;

a first source/drain doped region in the first fin on both sides of the first gate electrode; and a second source/drain doped region in the second fin on both sides of the second gate electrode, wherein:

a first transistor including the first gate electrode and the first source/drain doped region is formed on the first region, a second transistor including the second gate electrode and the second source/drain doped region is formed on the second region, and the first gate electrode and the second gate electrode are formed on two adjacent fins.

2. The semiconductor device according to claim 1, wherein:
    the base substrate includes a substrate and a plurality of fins on the substrate;
    the first source/drain doped region formed is within the fin in the first region on both sides of the first gate electrode; and
    the second source/drain doped region is formed within the fin in the second region on both sides of the second gate electrode.

3. The semiconductor device according to claim 1, wherein the semiconductor device further comprises:
    an interlayer dielectric layer on the first gate electrode, the second gate electrode, and the base substrate;
    the first gate electrode being a first metal gate in the interlayer dielectric layer; and
    the second gate electrode being a second metal gate in the interlayer dielectric layer.

4. The semiconductor device according to claim 1, wherein:
    the first transistor formed in the first region includes a core device; and
    the second transistor formed in the second region includes an TO device.

5. The semiconductor device according to claim 1, wherein:
    a size of the undercut structure at the bottom of the second gate electrode is in a range of 2 to 20 nm.

* * * * *